United States Patent
Wang

(10) Patent No.: US 9,985,661 B1
(45) Date of Patent: May 29, 2018

(54) REED-SOLOMON ERASURE CODE DECODER

(71) Applicant: Xilinx, Inc., San Jose, CA (US)

(72) Inventor: Hong Qiang Wang, Shanghai (CN)

(73) Assignee: XILINX, INC., San Jose, CA (US)

( * ) Notice: Subject to any disclaimer, the term of this patent is extended or adjusted under 35 U.S.C. 154(b) by 91 days.

(21) Appl. No.: 15/096,659

(22) Filed: Apr. 12, 2016

(51) Int. Cl.
*H03M 13/00* (2006.01)
*H03M 13/37* (2006.01)
*H04L 12/58* (2006.01)

(52) U.S. Cl.
CPC ....... *H03M 13/373* (2013.01); *H03M 13/611* (2013.01); *H04L 51/063* (2013.01); *H04L 51/18* (2013.01)

(58) Field of Classification Search
CPC ............ H03M 13/154; H03M 13/616; H03M 13/151; H03M 13/1515; H03M 13/3761; H03M 13/373; H03M 13/1191; H03M 13/27; H03M 13/2909; H03M 13/2918; H03M 13/2921; H03M 13/2906; H03M 13/15; H04W 28/065; H04L 1/0057; H04L 1/0041; G06F 11/1004
See application file for complete search history.

(56) References Cited

U.S. PATENT DOCUMENTS

| 7,472,334 | B1 * | 12/2008 | Scott | ................... H03M 13/151 714/785 |
| 2006/0218470 | A1 * | 9/2006 | Dickson | .............. G06F 11/1076 714/767 |
| 2008/0222480 | A1 * | 9/2008 | Huang | ............... H03M 13/1191 714/752 |
| 2016/0056920 | A1 * | 2/2016 | Summerson | ........ H04W 28/065 714/776 |

OTHER PUBLICATIONS

Ruan, Matt, "Reed-Solomon Erasure Codec Design Using Vivado High-Level Synthesis," XAPP1273 (v1.0), Mar. 14, 2016, pp. 1-18, Xilinx, Inc., San Jose, California, USA.
Specification and drawings for U.S. Appl. No. 15/098,709, filed Apr. 14, 2016, Ruan.

* cited by examiner

*Primary Examiner* — Guerrier Merant
(74) *Attorney, Agent, or Firm* — Joshua Hamberger

(57) ABSTRACT

Techniques for decoding potentially corrupted Reed-Solomon encoded messages are provided. To decode a message, an incoming message is classified into a group based on which symbols of the message have survived (a "survival pattern"). The same inversion matrix may be used for each survival pattern associated with a single group. This reduces the amount of work required and data that is to be stored in order to perform the matrix multiplication that decodes the message.

20 Claims, 4 Drawing Sheets

REED-SOLOMON ERASURE CODE DECODER

TECHNICAL FIELD

Examples of the present disclosure generally relate to electronic circuits and, in particular, to a Reed-Solomon Erasure Code Decoder.

BACKGROUND

Reed-Solomon code is a technique for adding fault tolerance to data by adding an amount of code data. Both encoding and decoding involve matrix multiplication. To encode a message, a vector representing the data to be encoded is multiplied by a distribution matrix to obtain a coded message. After the message passes through a data link, which may result in one or more erasures to the message, a decoder decodes the potentially corrupted message by multiplying the message by an inversion matrix that is based on the distribution matrix to obtain a decoded matrix. The complexity of matrix multiplication leads to difficulties in efficiently implementing a decoder in circuitry.

SUMMARY

Techniques for decoding a Reed-Solomon encoded message are described. In an example, a method for decoding a message having one or more erasures is provided. The method includes mapping a survival pattern for the message to a survival pattern group of a plurality of survival pattern groups, wherein one or more of the survival pattern groups of the plurality of survival pattern groups includes two or more survival patterns with common survived symbols. The method also includes selecting survived symbols of the message based on the survival pattern group. The method further includes selecting an inversion matrix based on the survival pattern group. The method also includes performing a matrix multiplication based on the survived symbols and the inversion matrix to obtain a decoded message.

In another example, a circuit for decoding a message having one or more erasures is provided. The circuit includes a survival pattern mapping unit configured to map a survival pattern for the message to a survival pattern group of a plurality of survival pattern groups, wherein one or more of the survival pattern groups of the plurality of survival pattern groups includes two or more survival patterns with common survived symbols. The circuit also includes a multiplexor coupled to the survival pattern mapping unit and configured to select survived symbols of the message based on the survival pattern group. The circuit further includes an inversion matrix lookup unit coupled to the survival pattern mapping unit and configured to select an inversion matrix based on the survival pattern group. The circuit also includes a multiplier unit configured to perform a matrix multiplication based on the survived symbols and the inversion matrix to obtain a decoded message.

In another example, a field-programmable gate array including a circuit for decoding a message having one or more erasures is provided. The circuit includes a survival pattern mapping unit configured to map a survival pattern for the message to a survival pattern group of a plurality of survival pattern groups, wherein one or more of the survival pattern groups of the plurality of survival pattern groups includes two or more survival patterns with common survived symbols. The circuit also includes a multiplexor coupled to the survival pattern mapping unit and configured to select survived symbols of the message based on the survival pattern group. The circuit further includes an inversion matrix lookup unit coupled to the survival pattern mapping unit and configured to select an inversion matrix based on the survival pattern group. The circuit also includes a multiplier unit configured to perform a matrix multiplication based on the survived symbols and the inversion matrix to obtain a decoded message.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
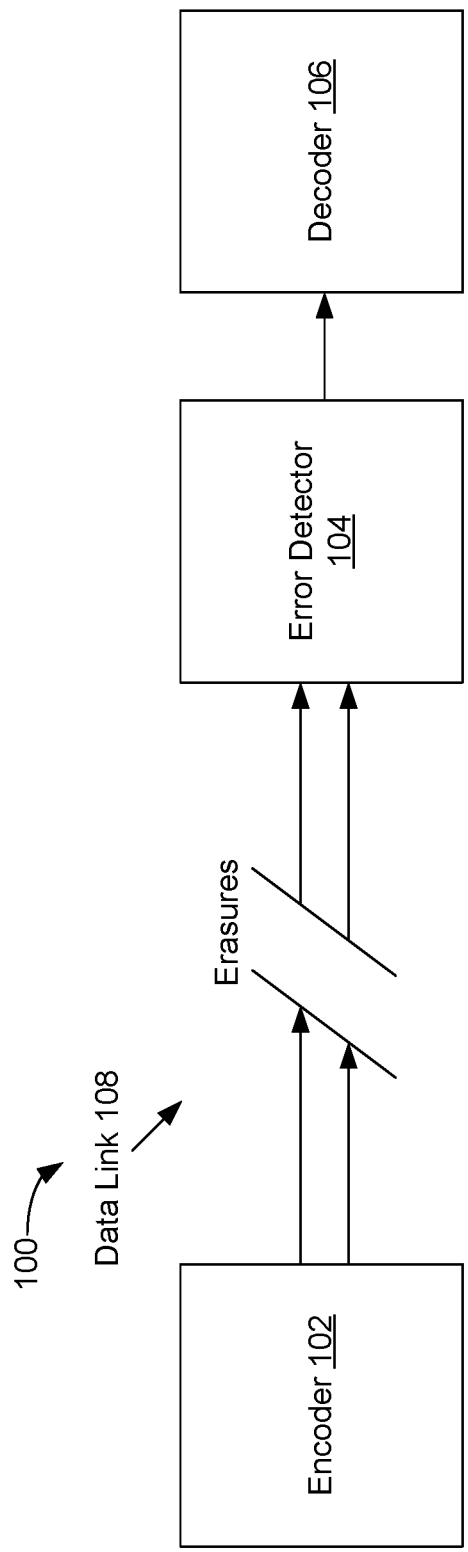
FIG. 1 is a block diagram that illustrates a Reed-Solomon Code system, according to an embodiment.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

Techniques for decoding potentially corrupted Reed-Solomon encoded messages are provided. To decode a message, an incoming message is classified into a group based on which symbols of the message have survived (a "survival pattern"). The same inversion matrix may be used for each survival pattern associated with a single group. This reduces the amount of work required and data that is to be stored in order to perform the matrix multiplication that decodes the message.

FIG. 1 is a block diagram that illustrates a Reed-Solomon Code system 100, according to an embodiment. As shown, the Reed-Solomon Code system 100 includes an encoder 102, an error detector 104, and a decoder 106. The encoder 102 applies Reed-Solomon coding to an input message. The input message comprises one or more symbols, where each symbol includes one or more bits. Reed-Solomon coding processes an input message to add a certain number of coding symbols to the message to form a coded message. The coding symbols add fault tolerance to the message so that the original message may be recovered despite loss of up to a threshold number of symbols. A Reed-Solomon encoding paradigm in which m coding symbols are added to n data symbols may be referred to herein as "RS(n,m)." Throughout this application, an example of 6 symbols of original data and 3 symbols of coding data will be used to discuss the concepts presented herein, but it should be recognized that teachings of the disclosure can be applied to encoding schemes with different numbers of data and/or coding symbols.

After encoding, the coded message passes through a data link 108 which may impart noise to the coded message. A corrupted coded message, which may include zero or more erasures, results from passing through the data link 108. The error detector 104 identifies which symbols are erased from the coded message and outputs the data that is not erased to the decoder 106, which decodes the "survived" data to rebuild the original message.

The encoder 102, error detector 104, and decoder 106 may be embodied as a computer system with a processor and memory configured to execute software, or as an application specific integrated circuit, that are configured to perform the operations described herein. The encoder 102, error detector 104, and decoder 106 may alternatively be implemented as a circuit within a field programmable gate array (FPGA), such as the FPGA described below with respect to FIG. 4.

To encode data, the encoder 102 multiplies a pre-defined "distribution matrix" by a vector that includes the symbols of the original data. The distribution matrix has dimension n×(n+m), where n is the number of symbols in the original data and m is the number of coding symbols. Multiplying the distribution matrix by the original data vector, results in a m+n length vector that includes n data symbols and m coding symbols. This m+n length vector may be called a coded message.

An example distribution matrix "B" for encoding a message in RS(6,3) is as follows:

| 1 | 0 | 0 | 0 | 0 | 0 |
|---|---|---|---|---|---|
| 0 | 1 | 0 | 0 | 0 | 0 |
| 0 | 0 | 1 | 0 | 0 | 0 |
| 0 | 0 | 0 | 1 | 0 | 0 |
| 0 | 0 | 0 | 0 | 1 | 0 |
| 0 | 0 | 0 | 0 | 0 | 1 |
| $B_{11}$ | $B_{12}$ | $B_{13}$ | $B_{14}$ | $B_{15}$ | $B_{16}$ |
| $B_{21}$ | $B_{22}$ | $B_{23}$ | $B_{24}$ | $B_{25}$ | $B_{26}$ |
| $B_{31}$ | $B_{32}$ | $B_{33}$ | $B_{34}$ | $B_{35}$ | $B_{36}$ |

In this distribution matrix, the first n rows comprise a sub-matrix that is the identity matrix for a 6 element vector and the last m rows comprise elements that encode the m coding bits. Multiplying this matrix by a vector comprising the original data (a vector of length n) results in a coded message (a vector of length n+m).

Noise in the data link 108 may result in erasures to the coded message, which error detector 104 detects. Despite these erasures, the decoder 106 is able to recover the original data. If too many erasures are present in the coded message, however, then the original data cannot be recovered. With RS(6,3), up to 3 erasures can be corrected. In general, the number of erasures that can be corrected is equal to the number of coding symbols added to the original message.

In one example, a coded message includes 6 symbols of data and 3 coding symbols. The 6 symbols of data are identified as data_0 through data_5 and the 3 coding symbols are identified as code_0 through code_2. The following data symbols have survived: data_0, data_1, data_3, data_4, and the following code symbols have survived: code_0 and code_2. Thus, the following symbols are considered to have been erased: data_2, data_5, and code_1. A survive pattern, which is a bitmap that indicates which symbols have survived, may be represented herein in binary or in decimal values. The order of the bits in a binary representation of a survive pattern reflects the order of the symbols in a message. In the example above, the order of the bits of the survive pattern would correspond to the following symbols, in order: data_0, data_1, data_2, data_3, data_4, code_0, code_1, and code_2. Thus, the survive pattern for the above-described message can be represented in binary as 110110101, where a "1" indicates survived data and a "0" indicates erased data. In decimal, the survive pattern is 437.

The error detector 104 may be implemented in any technically feasible manner. In one embodiment, the error detector 104 detects erasures in the coded message by checking parity bits included in each symbol. If the parity bits are in accordance with the non-parity bits of the symbol, then the error detector 104 determines that the symbol has not been erased and if the parity bits indicate an error in the symbol, then the error detector 104 determines that the symbol has been erased. Other technically feasible techniques for detecting erased symbols may also of course be used.

The decoder 106 recovers the original message by multiplying an inversion matrix by the non-erased symbols, also referred to as the "survival data." The inversion matrix is an inverse of a "reduced" matrix comprising rows of the distribution matrix corresponding to the survived data are obtained. Continuing with the examples above, symbols of the coded message that have survived include the first, second, fourth, fifth, seventh, and ninth symbols. A corresponding reduced matrix thus includes the first, second, fourth, fifth, seventh, and ninth rows of the distribution matrix, rendering the following matrix:

| 1 | 0 | 0 | 0 | 0 | 0 |
|---|---|---|---|---|---|
| 0 | 1 | 0 | 0 | 0 | 0 |
| 0 | 0 | 0 | 1 | 0 | 0 |
| 0 | 0 | 0 | 0 | 1 | 0 |
| $B_{11}$ | $B_{12}$ | $B_{13}$ | $B_{14}$ | $B_{15}$ | $B_{16}$ |
| $B_{31}$ | $B_{32}$ | $B_{33}$ | $B_{34}$ | $B_{35}$ | $B_{36}$ |

The inversion matrix is the inverse of this matrix. As is known, the inverse of a first matrix is a matrix that, when multiplied by the first matrix, results in the identity matrix. Thus, the inversion matrix is a matrix that, when multiplied by the above reduced matrix, results in the identity matrix. By multiplying this inversion matrix by the survived data, the decoder 106 recovers the original data.

Matrix multiplication, required for operation of the decoder 106, is not a straightforward operation and may consume a large number of processing resources and time. Thus, provided herein is an improved decoder 106 for efficient decoding of coded messages that include zero or more erasures.

Figure 2:
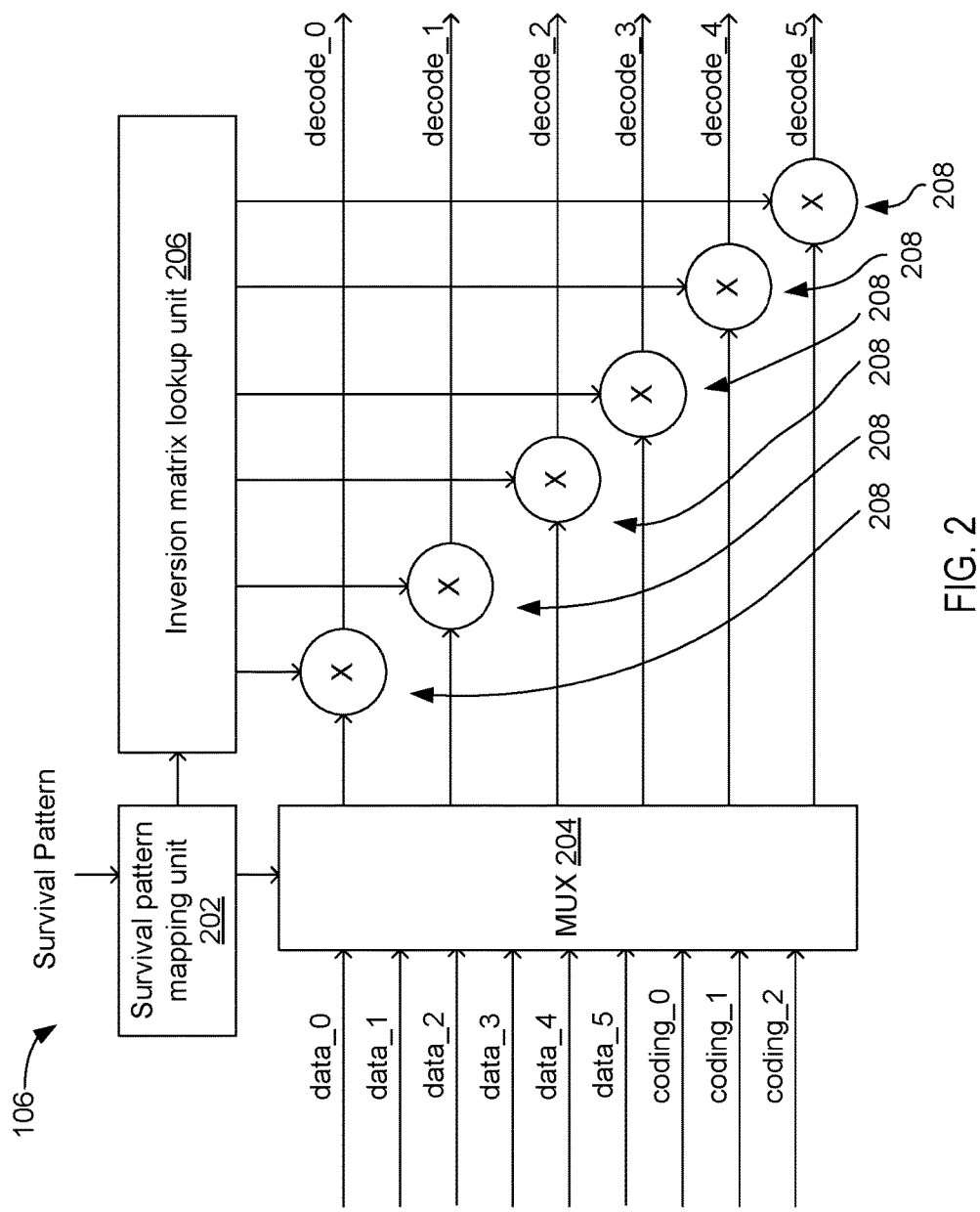
FIG. 2 is a block diagram of the decoder, according to an embodiment.

FIG. 2 is a block diagram of the decoder 106, according to an embodiment. As shown, the decoder 106 includes a survival pattern mapping unit 202, a multiplexor 204, an inversion matrix lookup unit 206, and partial matrix multipliers 208. The survival pattern mapping unit 202 accepts a survival pattern from the error detector 104 and identifies a survival pattern group. The survival pattern mapping unit 202 applies the survival pattern group to the inversion matrix lookup unit 206, which outputs values of the inversion matrix that corresponds to the survival pattern group. The survival pattern mapping unit 202 also outputs the survival pattern group to the multiplexor 204. The survival pattern group indicates which symbols, out of all inputs to the multiplexor 204, are chosen for application to the partial matrix multipliers 208. The partial matrix multipliers 208 apply operations that effectively multiply the vector associated with the data received from the multiplexor 204 by the matrix associated with the data received from the inversion matrix lookup unit 206.

As described above, the decoder 106 multiplies an inversion matrix by the survived data to obtain decoded data. The number of possible inversion matrices depends on the number of data symbols and the number of coding symbols and is related to the number of survival patterns for which data recovery is possible. This number is based on the number of coding symbols, because data recovery is only possible with a number of erasures less than or equal to the number of coding symbols. In the example of RS(6,3) described herein, data recovery is only possible with three or fewer erasures.

Additionally, there is a 1:1 correspondence between survival patterns and inversion matrices. More specifically, because inversion matrices are based on which data has survived, the inversion matrix is different for each survival pattern. Thus, the number of possible inversion matrices is based on the number of possible survival patterns. For RS(6,3), the number of possible survival patterns is equal to the number of survival patterns with zero erasures plus the number of patterns with one erasure plus the number of patterns with two erasures plus the number of patterns with three erasures, which is mathematically expressed as:

$$C_9^0 + C_9^1 + C_9^2 + C_9^3$$

which equals 1+9+36+84 and equals 130. This number can be reduced based on the fact that some survival patterns include certain commonalities. More specifically, certain survival patterns, while different, nonetheless include a sufficient number of survived data in common that the same inversion matrix can be used. Because only a number ("n") of survived data equal to the number of data symbols is required for decoding, survival patterns with n 1's in common can be grouped together into survival pattern groups (where, again, the value 1 indicates that the symbol survived and is not erased) and the same inversion matrix can be used for each survival pattern in a survival pattern group. An example set of survival pattern groupings, for RS(6,3), is provided below:

TABLE 1

| Survival Pattern Groups | |
|---|---|
| Pattern(s) | Group |
| 511 (111111111) | 1 |
| 510 (111111110) | |
| 509 (111111101) | |
| 508 (111111100) | |
| 507 (111111011) | |
| 506 (111111010) | |
| 505 (111111001) | |

TABLE 1-continued

| Survival Pattern Groups | |
|---|---|
| Pattern(s) | Group |
| 504 (111111000) | |
| 503 (111110111) | 2 |
| 502 (111110110) | |
| 501 (111110101) | |
| 500 (111110100) | |
| 499 (111110011) | 3 |
| 498 (111110010) | |
| 497 (111110001) | 4 |
| 495 (11101111) | 5 |
| 494 (11101110) | |
| 493 (11101101) | |
| 492 (11101100) | |
| 491 (11101011) | 6 |
| 490 (11101010) | |
| 489 (111101001) | 7 |
| 487 (11100111) | 8 |
| 486 (11100110) | |
| 485 (11100101) | 9 |
| 483 (111100011) | 10 |
| 479 (11011111) | 11 |
| 478 (11011110) | |
| 477 (11011101) | |
| 476 (11011100) | |
| 475 (11011011) | 12 |
| 474 (11011010) | |
| 473 (110110011) | 13 |
| 471 (11010111) | 14 |
| 470 (11010110) | |
| 469 (110101001) | 15 |
| 467 (110100011) | 16 |
| 463 (11001111) | 17 |
| 462 (11001110) | |
| 461 (110011001) | 18 |
| 459 (110010011) | 19 |
| 455 (110000111) | 20 |
| 447 (10111111) | 21 |
| 446 (10111110) | |
| 445 (10111101) | |
| 444 (10111100) | |
| 443 (10111011) | 22 |
| 442 (10111010) | |
| 441 (101110001) | 23 |
| 439 (10110111) | 24 |
| 438 (10110110) | |
| 437 (101101001) | 25 |
| 435 (101100011) | 26 |
| 431 (10101111) | 27 |
| 430 (10101110) | |
| 429 (101011001) | 28 |
| 427 (101010011) | 29 |
| 423 (101000111) | 30 |
| 415 (1001111) | 31 |
| 414 (10011110) | |
| 413 (100111001) | 32 |
| 411 (100110011) | 33 |
| 407 (100100111) | 34 |
| 399 (100001111) | 35 |
| 383 (11111111) | 36 |
| 382 (11111110) | |
| 381 (11111101) | |
| 380 (11111100) | |
| 379 (11111011) | 37 |
| 378 (11111010) | |
| 377 (011111001) | 38 |
| 375 (11110111) | 39 |
| 374 (11110110) | |
| 373 (011101001) | 40 |
| 371 (011100011) | 41 |
| 367 (11101111) | 42 |
| 366 (11101110) | |
| 365 (011011001) | 43 |
| 363 (011010011) | 44 |
| 359 (011000111) | 45 |
| 351 (1011111) | 46 |
| 350 (1011110) | |
| 349 (010111101) | 47 |

TABLE 1-continued

Survival Pattern Groups

| Pattern(s) | Group |
|---|---|
| 347 (101011011) | 48 |
| 343 (101010111) | 49 |
| 335 (101001111) | 50 |
| 319 (100111111) | 51 |
| 318 (100111110) | |
| 317 (100111101) | 52 |
| 315 (100111011) | 53 |
| 311 (100110111) | 54 |
| 303 (100101111) | 55 |
| 287 (100011111) | 56 |
| 255 (011111111) | 57 |
| 254 (011111110) | |
| 253 (011111101) | |
| 252 (011111100) | |
| 251 (011111011) | 58 |
| 250 (011111010) | |
| 249 (011111001) | 59 |
| 247 (011110111) | 60 |
| 246 (011110110) | |
| 245 (011110101) | 61 |
| 243 (011110011) | 62 |
| 239 (011101111) | 63 |
| 238 (011101110) | |
| 237 (011101101) | 64 |
| 235 (011101011) | 65 |
| 231 (011100111) | 66 |
| 223 (011011111) | 67 |
| 222 (011011110) | |
| 221 (011011101) | 68 |
| 219 (011011011) | 69 |
| 215 (011010111) | 70 |
| 207 (011001111) | 71 |
| 191 (010111111) | 72 |
| 190 (010111110) | |
| 189 (010111101) | 73 |
| 187 (010111011) | 74 |
| 183 (010110111) | 75 |
| 175 (010101111) | 76 |
| 159 (010011111) | 77 |
| 127 (001111111) | 78 |
| 126 (001111110) | |
| 125 (001111101) | 79 |
| 123 (001111011) | 80 |
| 119 (001110111) | 81 |
| 111 (001101111) | 82 |
| 95 (001011111) | 83 |
| 63 (000111111) | 84 |

For the groups in table 1 that include more than one survival pattern, the bits representing survived data that are shared are indicated in bold. For example, in group 1, each of the survive patterns indicates that the first six symbols have survived.

The survival pattern mapping unit 202 maps a survival pattern to a survive pattern group. For RS(6,3), the survival pattern mapping unit 202 receives 9 bits of the survive pattern and outputs 7 bits identifying a survive pattern group to both the multiplexor 204 and the inversion matrix lookup unit 206. The multiplexor 204 is configured to select the input symbols (i.e., either data symbols or code symbols) based on the survive data commonality and the inversion matrix lookup unit 206 is configured to lookup elements of an inversion matrix for the survive data commonality. More specifically, for each of the common groups, inversion matrix lookup unit 206 stores elements of a corresponding inversion matrix. The inversion matrix lookup unit 206 selects such elements based on the input group number. The inversion matrix lookup unit 206 applies the inversion matrix elements to the partial matrix multipliers 208 and the multiplexor 204 applies the selected input symbols to the partial matrix multipliers 208. The partial matrix multipliers 208 implement matrix multiplication to output decoded data, which comprises the original data symbols prior to encoding. Storing inversion matrices in the inversion matrix lookup unit 206 helps to reduce the amount of processing required for the decoding discussed herein. Processing power is reduced because calculations for determining the inversion matrix are not required. For example, calculations for inverting a matrix, which are particularly work-intensive, are not required. Further, because the number of possible inversion matrices is reduced due to the use of survive pattern groups, the number of inversion matrices that needs to be stored by the inversion matrix lookup unit 206 is reduced and thus the amount of memory required to store the inversion matrices is reduced.

As is generally known, multiplication of a matrix by a vector to generate a product vector involves calculating a sum of products for each element of the product vector. An example is provided below:

$$\begin{bmatrix} I_{11} & I_{12} & I_{13} & I_{14} & I_{15} & I_{16} \\ I_{21} & I_{22} & I_{23} & I_{24} & I_{25} & I_{26} \\ I_{31} & I_{32} & I_{33} & I_{34} & I_{35} & I_{36} \\ I_{41} & I_{42} & I_{43} & I_{44} & I_{45} & I_{46} \\ I_{51} & I_{52} & I_{53} & I_{54} & I_{55} & I_{56} \\ I_{61} & I_{62} & I_{63} & I_{64} & I_{65} & I_{66} \end{bmatrix} * \begin{bmatrix} S_1 \\ S_2 \\ S_3 \\ S_4 \\ S_5 \\ S_6 \end{bmatrix} = \begin{bmatrix} S_1 I_{11} + \ldots + S_6 I_{16} \\ S_1 I_{21} + \ldots + S_6 I_{26} \\ S_1 I_{31} + \ldots + S_6 I_{36} \\ S_1 I_{41} + \ldots + S_6 I_{46} \\ S_1 I_{51} + \ldots + S_6 I_{56} \\ S_1 I_{61} + \ldots + S_6 I_{66} \end{bmatrix}$$

In the matrices above, I represents elements of the inversion matrix and S represents survive data symbols. Many individual multiplications between matrix elements are involved. Because multiplication can be complicated and can potentially consume multiple cycles, simplified operations for performing multiplication are provided. These operations rely on certain aspects of Galois Field mathematics, which is the arithmetic used for Reed-Solomon coding.

Galois Field ("GF") arithmetic is modular arithmetic, meaning that any operation that produces a number greater than the number of elements in the field is converted to an element in the field by performing a modulo operation of the result with a prime number that defines the field. Additionally, in GF arithmetic, it is common to represent elements as polynomials with binary coefficients, of the form:

$$c_7 \alpha_7 + c_6 \alpha_6 + c_5 \alpha_5 + \ldots + c_0$$

where $\alpha$ is called the primitive element with decimal representation 2 and binary representation 00000010. Powers of alpha greater than the $\log_2 q$, for GF(q) are still within GF(q), because GF arithmetic is modular.

Using the polynomial convention, the prime number described above is referred to as the generator polynomial and has degree m, for a Galois Field $GF(2^m)$. One example generator polynomial is:

$$p(x) = x^8 + x^4 + x^3 + x^2 + 1$$

Because a is the root of the generator polynomial, p(a)=0 and $$\alpha^8 + \alpha^4 + \alpha^3 + \alpha^2 + 1 = 0$$

which means that $$\alpha^8 = \alpha^4 + \alpha^3 + \alpha^2 + 1,$$

taking advantage of the fact that addition and subtraction in GF arithmetic are interchangeable. Thus, the exponent of a equal to m can be replaced with an expression including exponents of lower than m. Because exponents of a higher than m can be represented as the product of two or more exponents of a of m or lower, the product of any two polynomials that results in a polynomial of degree higher than m can be reduced to a polynomial of degree m or lower by replacing any a values with exponent higher than m with a reduced expression derived from the generator polynomial as shown above. In the example with $GF(2^8)$ and with $p(x)=x^8+x^4+x^3+x^2+1$, the following equalities are true:

$$\alpha^9=\alpha^{8}*\alpha^1=\alpha^5+\alpha^4+\alpha^3+\alpha$$

$$\alpha^{10}=\alpha^{9}*\alpha^1=\alpha^6+\alpha^5+\alpha^4+\alpha^2$$

$$\alpha^{11}=\alpha^{10}*\alpha^1=\alpha^7+\alpha^6+\alpha^5+\alpha^3$$

$$\alpha^{12}=\alpha^{11}*\alpha^1=\alpha^8+\alpha^7+\alpha^6+\alpha^4$$

$$=\alpha^4+\alpha^3+\alpha^2+1+\alpha^7+\alpha^6+\alpha^4$$

$$=\alpha^7+\alpha^6+\alpha^3+\alpha^2+1$$

$$\alpha^{13}=\alpha^{12}*\alpha^1=\alpha^8+\alpha^7+\alpha^4+\alpha^3+\alpha$$

$$=\alpha^4+\alpha^3+\alpha^2+1+\alpha^7+\alpha^4+\alpha^3+\alpha$$

$$=\alpha^7+\alpha^2+\alpha+1$$

$$\alpha^{14}=\alpha^{13}*\alpha^1=\alpha^8+\alpha^3+\alpha^2+\alpha$$

$$=\alpha^4+\alpha^3+\alpha^2+1+\alpha^3+\alpha^2+\alpha$$

$$=\alpha^4+\alpha+1$$

As described above, the product of two $GF(2^8)$ numbers can be represented as a polynomial of degree 7+7=14. Thus, substitutions up to $\alpha^{14}$ can be used for $GF(2^8)$. For Galois Fields of other sizes, more or fewer substitutions are needed. The above equalities are true for the specific generator polynomial presented above and for $GF(2^8)$.

The purpose of reducing the degree of the product polynomial is to obtain a result that can be expressed in binary in $GF(2^8)$. The binary coefficient of each term of the resulting polynomial of degree 7 is equal to the bit value for a corresponding bit of the product. For example, the coefficient of $\alpha^7$ is the bit value for the 8$^{th}$ bit of the result. The coefficient of $\alpha^6$ is the bit value for the 7$^{th}$ bit, and so on. The product of two numbers is obtained by expressing the two multiplicands as a polynomial, multiplying the two polynomials to generate a product polynomial, and reducing the polynomial to degree m−1 (7 for $GF(2^8)$). The coefficients of the reduced polynomial, which depend on the values of the multiplicands, are the bit values of the product.

Multiplication of two numbers A and B for $GF(2^8)$ may be represented as follows:

$$A*B=(a_7\alpha^7+a_6\alpha^6+a_5\alpha^5+a_4\alpha^4+a_3\alpha^3+a_2\alpha^2+a_1\alpha+a_0)*$$
$$(b_7\alpha^7+b_6\alpha^6+b_5\alpha^5+b_4\alpha^4+b_3\alpha^3+b_2\alpha^2+b_1\alpha+b_0)$$

which can be expanded out based on standard polynomial multiplication techniques. The terms over degree 7 that result can be reduced to degree 7 or below with the substitutions discussed above. Because the coefficients of the A and B polynomials are single bit values, additions between coefficient values in the expanded polynomial can be replaced with bitwise AND operations and multiplications between coefficient values in the expanded polynomial can be replaced with bitwise XOR operations. For the example above, resultant bit values of a product, expressed as p0 through p7, can be expressed as follows, where ^ is XOR, & is AND, << is left shift and + is addition:

p7=a7b6a6b7^a7b5a5b7^a7b4a4b7^(a7 & b0)^(a6 & b1)^(a5 & b2)^(a4 & b3)^(a3 & b4)^(a2 & b5)^(a1 & b6)^(a0 & b7);

p6=a7b5a5b7^a7b4a4b7^a7b3a3b7^(a6 & b0)^(a5 & b1)^(a4 & b2)^(a3 & b3)^(a2 & b4)^(a1 & b5)^(a0 & b6);

p5=a7b4a4b7^a7b3a3b7^a7b2a2b7^(a5 & 130)^(a4 & b1)^(a3 & b2)^(a2 & b3)^(a1 & b4)^(a0 & b5);

p4=a7b7a7b7^a7b3a3b7^a7b2a2b7^a7b1a1b7^(a4 & 130)^(a3 & b1)^(a2 & b2)^(a1 & b3)^(a0 & b4);

p3=a7b5a5b7^a7b4a4b7^a7b2a2b7^a7b1a1b7^(a3 & b0)^(a2 & b1)^(a1 & b2)^(a0 & b3);

p2=a7b6a6b7^a7b5a5b7^a7b3a3b7^a7b1a1b7^(a2 & b0)^(a1 & b1)^(a0 & b2);

p1=a7b7a7b7^a7b6a6b7^a7b2a2b7^(a1 & b0)^(a0 & b1); and p0=a7b7a7b7^a7b6a6b7^a7b5a5b7^a7b1a1b7^(a0 & b0)

where:

a7b7a7b7=(a7 & b7);

a7b6a6b7=(a7 & b6)^(a6 & b7);

a7b5a5b7=(a7 & b5)^(a6 & b6)^(a5 & b7);

a7b4a4b7=(a7 & b4)^(a6 & b5)^(a5 & b6)^(a4 & b7);

a7b3a3b7=(a7 & b3)^(a6 & b4)^(a5 & b5)^(a4 & b6)^(a3 & b7);

a7b2a2b7=(a7 & b2)^(a6 & b3)^(a5 & b4)^(a4 & b5)^(a3 & b6)^(a2 & b7); and a7b1a1b7=(a7 & b1)^(a6 & b2)^(a5 & b3)^(a4 & b4)^(a3 & b5)^(a2 & b6)^(a1 & b7)

and the final product value p can be represented as:

$$p=(p7<<7)+(p6<<6)+(p5<<5)+(p4<<4)+(p3<<3)+(p2<<2)+(p1<<1)+(p0)$$

In hardware, the & operations and ^ operations can be implemented with corresponding logic gates. However, the operations shown for p do not necessarily need to be implemented in hardware, as the values produced for each of the bits can simply be routed to a result register in accord with the order of the bits.

As can be seen, the product of two numbers in $GF(2^8)$ can be determined with only a handful of XOR and AND gates for each bit of the product. Complicated and time consuming multiplication similar to long multiplication is unnecessary.

Figure 3:
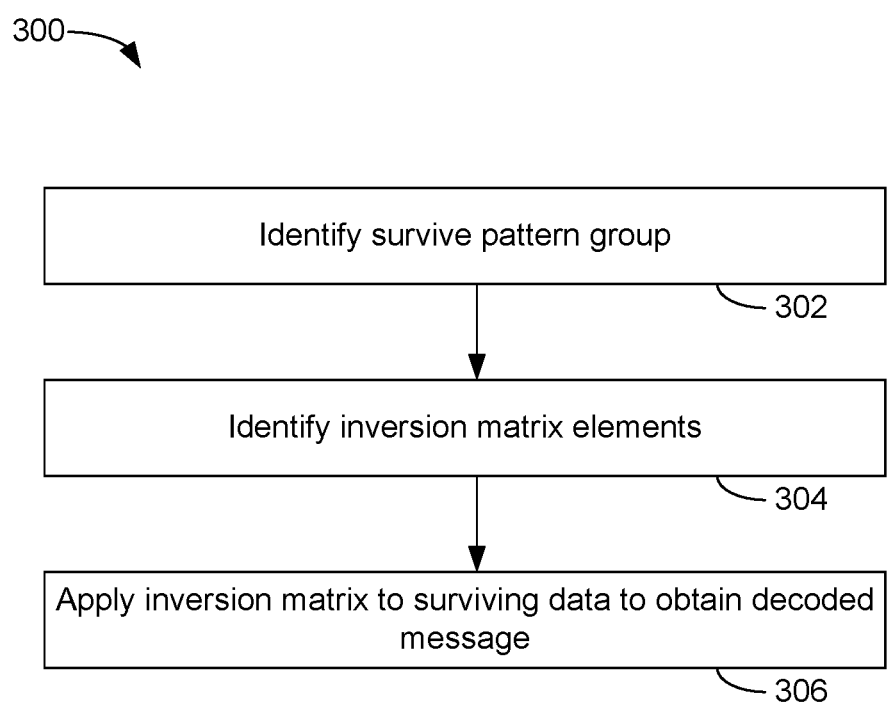
FIG. 3 is a flow diagram depicting a method of decoding a message encoded with Reed-Solomon encoding, according to an example.

FIG. 3 is a flow diagram depicting a method 300 of decoding a message encoded with Reed-Solomon encoding, according to an example. As shown, a method 300 begins at step 302, where a decoder 106 identifies a survive pattern group based on the survive pattern received from an error detector 104. As described above, a survive pattern is a bitmask that indicates which symbols of a Reed-Solomon encoded message have survived and which symbols are considered to be erased. Identifying a survive pattern group is performed by providing the survive pattern to a survival pattern mapping unit 202, which outputs the survive pattern group. As described above, survive pattern groups are groups of survive patterns that have a number of survived symbols in common equal to the minimum number required to decode the message. For example, one group might include all survival patterns where all of the data symbols have survived (e.g., a survival pattern where all of the first six bits are "1" in RS(6,3)). In some embodiments, the survival pattern mapping unit 202 is implemented as a lookup table that accepts the survival pattern as input and outputs the survival pattern group.

At step 304, the decoder 106 identifies inversion matrix elements by applying the survival pattern group to an inversion matrix lookup unit 206. The inversion matrix lookup unit 206 stores one inversion matrix per survival pattern group. In response to receiving the bits that identify the survival pattern group, the inversion matrix lookup unit 206 provides the elements of the inversion matrix to the matrix multipliers 208.

At step 306, the decoder 106 applies the inversion matrix to the survived data. Survived data is selected from input data via a multiplexor. The multiplexor receives the input data as well as the bits describing the survival pattern group to a multiplexor 204 which selects the input data corresponding to the survival pattern group. The multiplexor 204 outputs this selected data to the matrix multipliers 208, which applies the inversion matrix to the selected data to output the recovered original data.

Figure 4:
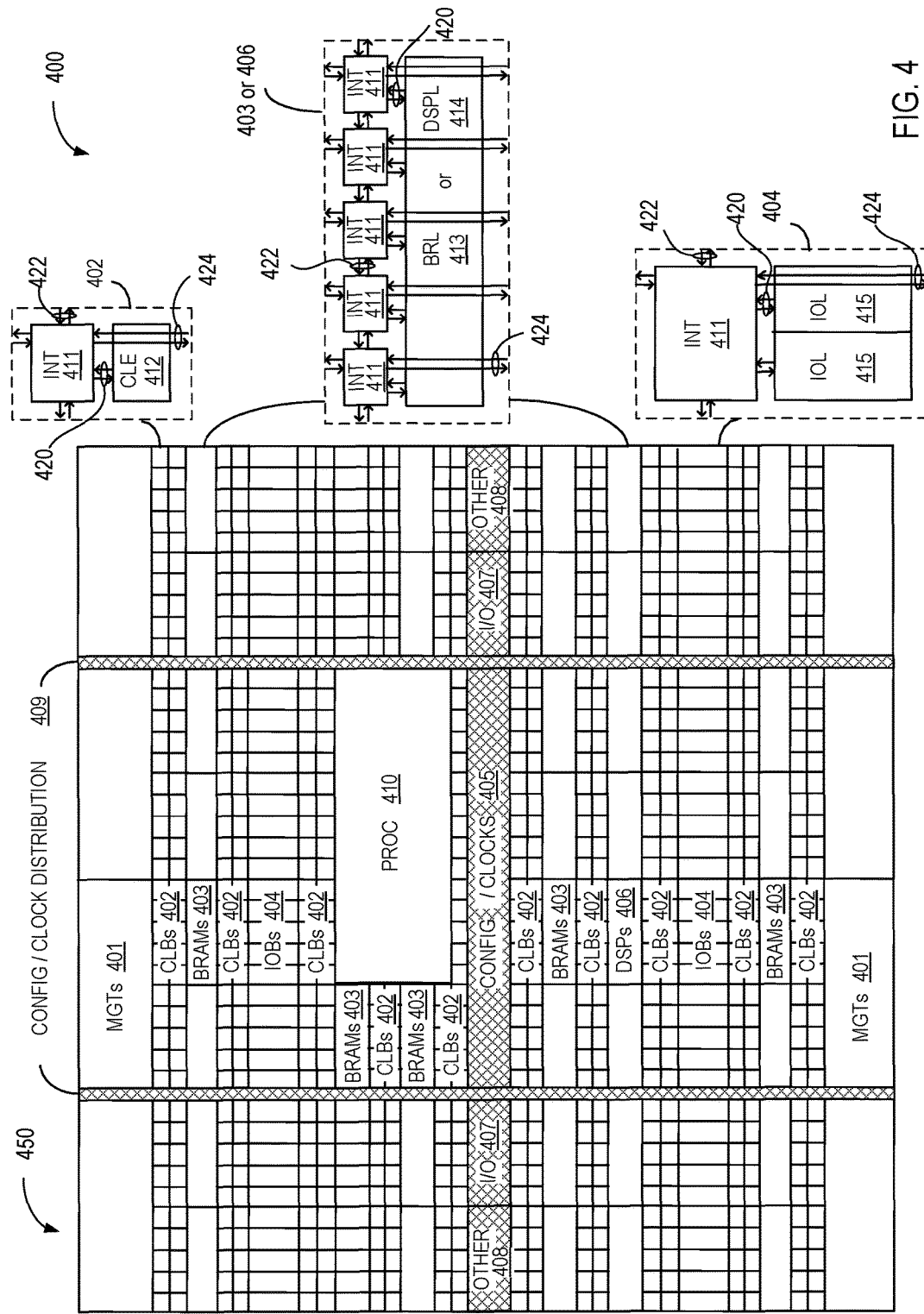
FIG. 4 illustrates an architecture of a field programmable gate array ("FPGA") in which the decoder described with respect to FIGS. 1-3 can be implemented, according to an example.

FIG. 4 illustrates an example architecture of a field programmable gate array ("FPGA") 400 in which the decoder 106 described with respect to FIGS. 1-3 can be implemented, according to an example. The FPGA 400 includes a large number of different programmable tiles in a programmable fabric 450, including multi-gigabit transceivers ("MGTs") 401, configurable logic blocks ("CLBs") 402, random access memory blocks ("BRAMs") 403, input/output blocks ("IOBs") 404, configuration and clocking logic ("CONFIG/CLOCKS") 405, digital signal processing blocks ("DSPs") 406, specialized input/output blocks ("I/O") 407 (e.g., configuration ports and clock ports), and other programmable logic 408, such as digital clock managers, analog-to-digital converters, system monitoring logic, and so forth. Some FPGAs also include dedicated processor blocks ("PROC") 410.

In some FPGAs, each programmable tile can include at least one programmable interconnect element ("INT") 411 having connections to input and output terminals 420 of a programmable logic element within the same tile, as shown by examples included at the top of FIG. 4. Each programmable interconnect element 411 (also referred to as "interconnect element 411") can also include connections to interconnect segments 422 of adjacent programmable interconnect element(s) in the same tile or other tile(s). Each programmable interconnect element 411 can also include connections to interconnect segments 424 of general routing resources between logic blocks (not shown). The general routing resources can include routing channels between logic blocks (not shown) comprising tracks of interconnect segments (e.g., interconnect segments 424) and switch blocks (not shown) for connecting interconnect segments. The interconnect segments of the general routing resources (e.g., interconnect segments 424) can span one or more logic blocks. The programmable interconnect elements 411 taken together with the general routing resources implement a programmable interconnect structure ("programmable interconnect") for the illustrated FPGA. As described further below, in some examples, some or all of the interconnect elements 411 can include additional circuitry for efficient implementation of TCAMs.

In an example implementation, a CLB 402 can include a configurable logic element ("CLE") 412 that can be programmed to implement user logic plus a single programmable interconnect element ("INT") 411. A BRAM 403 can include a BRAM logic element ("BRL") 413 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 406 can include a DSP logic element ("DSPL") 414 in addition to an appropriate number of programmable interconnect elements. An IOB 404 can include, for example, two instances of an input/output logic element ("IOL") 415 in addition to one instance of the programmable interconnect element 411. As will be clear to those of skill in the art, the actual I/O pads connected, for example, to the I/O logic element 415 typically are not confined to the area of the input/output logic element 415.

In the pictured example, a horizontal area near the center of the die (shown in FIG. 4) is used for configuration, clock, and other control logic. Vertical columns 409 extending from this horizontal area or column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, processor block 410 spans several columns of CLBs and BRAMs. The processor block 410 can include various components ranging from a single microprocessor to a complete programmable processing system of microprocessor(s), memory controllers, peripherals, and the like.

Note that FIG. 4 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 4 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. In another example, an FPGA can include an entire processing system (e.g., processor, memory, peripherals, etc.) instead of, or in addition to, the processor block 410. In such an implementation, a System-on-Chip (Soc) can include a programmable fabric (programmable logic as shown in FPGA 400) in communication with a processing system.

To implement the decoder, the survival pattern mapping unit 202 can be implemented in BRAMs 403 or in CLBs. The inversion matrix lookup unit 206 can also be implemented in BRAMs 403. The multiplexor 204 and matrix multipliers 208 can be implemented in CLBs.

While the foregoing is directed to specific examples, other and further examples may be devised without departing from the basic scope thereof, and the scope thereof is determined by the claims that follow.

What is claimed is:

1. A method of decoding a message having one or more erasures, the method comprising:
mapping a survival pattern for the message to a survival pattern group of a plurality of survival pattern groups, wherein one or more of the survival pattern groups of the plurality of survival pattern groups includes two or more survival patterns with common survived symbols;

generating a control signal indicative of the survival pattern group at a survival pattern mapping circuit;

selecting, by a multiplexer in response to the control signal and an input signal indicative of the message, survived symbols of the message based on the survival pattern group;

generating a first plurality of signals from the multiplexer indicative of the survived symbols;

selecting, by an inversion matrix lookup circuit configured to receive the control signal, an inversion matrix based on the survival pattern group;

generating a second plurality of signals from the inversion matrix lookup circuit indicative of the inversion matrix;

performing, using a multiplier circuit configured to receive the first and second pluralities of signals, a matrix multiplication based on the survived symbols and the inversion matrix to obtain a decoded message.

2. The method of claim 1, wherein:
the number of survived symbols that are common among the survival patterns of the one or more survival pattern groups is greater than or equal to a number of symbols of the message that enable decoding of the message.

3. The method of claim 2, wherein:
the survived symbols of the message that are selected correspond to the symbols that are common among the survival patterns of the survival pattern group.

4. The method of claim 1, wherein:
the inversion matrix is stored in a memory that includes a plurality of inversion matrices, each of which corresponds to a different survival pattern group.

5. The method of claim 1, wherein:
the inversion matrix is an inverse of a distribution matrix with rows corresponding to erased symbols of the message.

6. The method of claim 1, further comprising:
detecting erasures in the message based on parity bits within symbols of the message.

7. The method of claim 1, wherein performing the matrix multiplication comprises:
performing bitwise AND and XOR operations on the survived symbols and the inversion matrix.

8. The method of claim 7, wherein:
the bitwise AND and XOR operations are based on a polynomial product reduced to a degree corresponding to the size of a Galois Field in which the message is encoded.

9. The method of claim 1, wherein the message is a Reed-Solomon encoded message.

10. A circuit for decoding a message having one or more erasures, the circuit comprising:
a survival pattern mapping circuit configured to map a survival pattern for the message to a survival pattern group of a plurality of survival pattern groups, wherein one or more of the survival pattern groups of the plurality of survival pattern groups includes two or more survival patterns with common survived symbols, and configured to generate a control signal indicative of the survival pattern group;

a multiplexor configured to receive the control signal and an input signal indicative of the message, to select survived symbols of the message based on the survival pattern group, and to output a first plurality of signals indicative of the survived symbols;

an inversion matrix lookup circuit configured to receive the control signal, to select an inversion matrix based on the survival pattern group, and to generate a second plurality of signals indicative of the inversion matrix; and a multiplier circuit configured to receive the first and second pluralities of signals and perform a matrix multiplication based on the survived symbols and the inversion matrix to obtain a decoded message.

11. The circuit of claim 10, wherein:
the number of survived symbols that are common among the survival patterns of the one or more survival pattern groups is greater than or equal to a number of symbols of the message that enable decoding of the message.

12. The circuit of claim 11, wherein:
the survived symbols of the message that are selected correspond to the symbols that are common among the survival patterns of the survival pattern group.

13. The circuit of claim 10, wherein:
the inversion matrix lookup unit includes a memory that includes a plurality of inversion matrices, each of which corresponds to a different survival pattern group.

14. The circuit of claim 10, wherein:
the inversion matrix is an inverse of a distribution matrix with rows corresponding to erased symbols of the message deleted.

15. The circuit of claim 10, further comprising:
an error detector configured to detect erasures in the message based on parity bits within symbols of the message.

16. The circuit of claim 10, wherein the multiplication unit comprises:
AND and XOR gates configured to perform bitwise AND and XOR operations on the survived symbols and the inversion matrix.

17. The circuit of claim 16, wherein:
the bitwise AND and XOR operations are based on a polynomial product reduced to a degree corresponding to the size of a Galois Field in which the message is encoded.

18. The circuit of claim 10, wherein the message is a Reed-Solomon encoded message.

19. A field-programmable gate array including a circuit for decoding a message having one or more erasures, the circuit comprising:
a survival pattern mapping circuit configured to map a survival pattern for the message to a survival pattern group of a plurality of survival pattern groups, wherein one or more of the survival pattern groups of the plurality of survival pattern groups includes two or more survival patterns with common survived symbols, and configured to generate a control signal indicative of the survival pattern group;

a multiplexor configured to receive the control signal and an input signal indicative of the message to select survived symbols of the message based on the survival pattern group, and to output a first plurality of signals indicative of the survived symbols;

an inversion matrix lookup circuit configured to receive the control signal to select an inversion matrix based on the survival pattern group, and to generate a second plurality of signals indicative of the inversion matrix; and a multiplier circuit configured to receive the first and second pluralities of signals and perform a matrix multiplication based on the survived symbols and the inversion matrix to obtain a decoded message.

20. The field-programmable gate array of claim 19, wherein:

the inversion matrix lookup unit is implemented in random access memory blocks of the field-programmable gate array; and the multiplier unit is implemented in configurable logic blocks of the field-programmable gate array.

* * * * *